United States Patent
Chopra et al.

(10) Patent No.: US 6,830,500 B2
(45) Date of Patent: *Dec. 14, 2004

(54) SLURRY FOR USE WITH FIXED-ABRASIVE POLISHING PADS IN POLISHING SEMICONDUCTOR DEVICE CONDUCTIVE STRUCTURES THAT INCLUDE COPPER AND TUNGSTEN AND POLISHING METHODS

(75) Inventors: Dinesh Chopra, Boise, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 77 days.

This patent is subject to a terminal disclaimer.

(21) Appl. No.: 10/132,827

(22) Filed: Apr. 25, 2002

(65) Prior Publication Data

US 2002/0123299 A1 Sep. 5, 2002

Related U.S. Application Data

(62) Division of application No. 09/651,808, filed on Aug. 30, 2000, now Pat. No. 6,602,117.

(51) Int. Cl.$^7$ ............................. B24B 1/00; H01L 21/00
(52) U.S. Cl. ............................. 451/36; 216/38; 216/89; 438/693; 438/745; 438/754; 751/41
(58) Field of Search ............................. 451/36, 41, 59, 451/63; 216/88, 89, 38; 438/690, 692, 693, 691, 745, 754

(56) References Cited

U.S. PATENT DOCUMENTS 5,780,358 A 7/1998 Zhou et al.
5,836,806 A 11/1998 Cadien et al.
5,840,629 A 11/1998 Carpio (List continued on next page.)

FOREIGN PATENT DOCUMENTS

| WO | WO 98/49723 | 11/1998 |
| WO | WO 00/00561 | 1/2000 |
| WO | WO 00/28586 | 5/2000 |
| WO | WO 01/21724 A1 | 3/2001 |

OTHER PUBLICATIONS

Lee, Michael G., et al., "Planarization of Copper/Polyimide for Multilevel Interconnects by Chemical Mechanical Polishing (CMP)," VMIC (1996), pp. 395–397, Proceedings of 13$^{th}$ Internat'l. VLSI Multilevel Interconnection Conf., Santa Clara, CA, Jun. 18–20, 1996.

(List continued on next page.)

Primary Examiner—Timothy V. Eley
(74) Attorney, Agent, or Firm—TraskBritt (57) ABSTRACT

A method for substantially simultaneously polishing a copper conductive structure of a semiconductor device structure and an adjacent barrier layer includes use of a fixed-abrasive type polishing pad with a substantially abrasive-free slurry in which copper is removed at a rate that is substantially the same as or faster than a rate at which a material, such as tungsten, of the barrier layer is removed. The slurry is formulated so as to oxidize copper at substantially the same rate as or at a faster rate than a material of the barrier layer is oxidized. Thus, copper and the barrier layer material have substantially the same oxidation energies in the slurry or the oxidation energy of the barrier layer material in the slurry may be greater than that of copper. Systems for substantially polishing copper conductive structures and adjacent barrier structures on semiconductor device structures are also disclosed.

40 Claims, 4 Drawing Sheets

U.S. PATENT DOCUMENTS

| | | | |
|---|---|---|---|
| 5,846,398 A | | 12/1998 | Carpio |
| 5,863,307 A | | 1/1999 | Zhou et al. |
| 5,897,375 A | | 4/1999 | Watts et al. |
| 5,954,975 A | | 9/1999 | Cadien et al. |
| 5,954,997 A | | 9/1999 | Kaufman et al. |
| 5,985,748 A | | 11/1999 | Watts et al. |
| 6,001,730 A | | 12/1999 | Farkas et al. |
| 6,046,099 A | | 4/2000 | Cadien et al. |
| 6,063,306 A | | 5/2000 | Kaufman et al. |
| 6,083,419 A | | 7/2000 | Grumbine et al. |
| 6,083,840 A | | 7/2000 | Mravic et al. |
| 6,100,197 A | | 8/2000 | Hasegawa |
| 6,245,655 B1 | * | 6/2001 | Moslehi ................. 438/612 |
| 6,375,693 B1 | | 4/2002 | Cote et al. |
| 6,409,781 B1 | | 6/2002 | Wojtczak et al. |
| 6,447,693 B1 | * | 9/2002 | Pryor .................. 252/79.1 |
| 6,461,225 B1 | * | 10/2002 | Misra et al. ............... 451/41 |
| 6,551,935 B1 | * | 4/2003 | Sinha et al. ............. 438/693 |
| 6,629,879 B1 | * | 10/2003 | Kim et al. ................ 451/57 |
| 2002/0022370 A1 | | 2/2002 | Sun et al. |
| 2002/0033382 A1 | | 3/2002 | Kaufman et al. |
| 2002/0098675 A1 | * | 7/2002 | Lin ....................... 438/618 |
| 2003/0087525 A1 | * | 5/2003 | Sinha et al. ............. 438/691 |

OTHER PUBLICATIONS

Stavreva, Z., et al., "Chemical—Mechanical Polishing of Copper for Interconnect Formation," Microelectronic Eng.,, vol. 33 (1997), pp. 249–257.

Seung–Mahn Lee, et al., "Study of Slurry Chemistry in Chemical Mechanical Polishing (CMP) of Copper," Database Chemabs Online!, Chemical Abstracts, Columbus, Ohio, Proceedings—Electrochmical Society (2000).

Seung–Mahn Lee, et al., "Fundamental Study of Iodate and Iodine Based Slurries for Copper CMP," Mat. Res. Soc. Symp., vol. 613, ©2000 Materials Research Society, pp. E7.8.1–E7.8.6.

PCT International Search Report of Jul. 30, 2002.

* cited by examiner

SLURRY FOR USE WITH FIXED-ABRASIVE POLISHING PADS IN POLISHING SEMICONDUCTOR DEVICE CONDUCTIVE STRUCTURES THAT INCLUDE COPPER AND TUNGSTEN AND POLISHING METHODS

CROSS-REFERENCE TO RELATED APPLICATION

This application is a divisional of application Ser. No. 09/651,808, filed Aug. 30, 2000, now U.S. Pat. No. 6,602,117, issued on Aug. 5, 2003.

BACKGROUND OF THE INVENTION

1. Field of the Invention

The present invention relates generally to slurries that are useful in chemical-mechanical polishing or chemical-mechanical planarization processes and, more specifically, to slurries that are used to polish or planarize electrically conductive structures of semiconductor devices that include copper and an adjacent tungsten barrier. The present invention also relates to methods for substantially concurrently polishing or planarizing structures formed from copper and tungsten.

2. Background of Related Art

CMP

Chemical-mechanical polishing and chemical-mechanical planarization, both of which are referred to in the art as "CMP", are abrasive techniques that typically include the use of a combination of chemical and mechanical agents to planarize, or otherwise remove material from a surface of a semiconductor material substrate during the fabrication of devices thereon. A chemical component, typically a slurry that includes one or more oxidizers, abrasives, complexing agents, and inhibitors, oxidizes the surface of one or more material layers that are being polished or planarized (i.e., at least partially removed). A polishing pad formed from a material such as polyurethane or acrylic is used with the slurry and, in combination with abrasives present in the slurry, effects mechanical removal of the layer or layers from the surface of the semiconductor device structure. It should be noted that abrasive-only polishing and planarization, e.g., without the use of active chemical agents to effect material removal, are becoming more prevalent due to environmental concerns. Thus, the term "CMP" as used herein encompasses such abrasive-only (i.e., strictly mechanical) methods and apparatus.

Conventional CMP pads are round, planar, and have larger dimensions than the semiconductor substrates (e.g., wafers or other substrates including silicon, gallium arsenide, indium phosphide, etc.) upon which the structures or layers to be planarized or otherwise polished have been formed. In polishing one or more layers or structures formed on a substrate, the substrate and the conventional CMP pad are rotated relative to one another, with the location of the substrate being moved continuously relative to the polishing surface of the pad so that different areas of the pad are used to polish one or more of the layers or structures formed on the substrate.

Another polishing format is the so-called "web" format, wherein the pad has an elongated, planar configuration. The web is moved laterally from a supply reel to a take-up reel so as to provide "fresh" areas thereof for polishing one or more layers or structures formed on a semiconductor substrate. A similar, newer polishing format is the so-called "belt" format, wherein the pad is configured as a belt, or continuous loop, of polishing material. In both the "web" and "belt" formats, the semiconductor substrate is rotated or revolved upon being brought into contact with the pad. The pad is moved when a "fresh" polishing surface is needed or desired.

A new type of polishing pad, known in the art as a fixed-abrasive pad, may be used to polish or planarize layers formed on a semiconductor substrate. Fixed-abrasive pads, which may be embodied in the conventional, web, or belt formats, are typically formed from an acrylic material and embedded with particles of abrasive materials. The pad and embedded abrasives effect the mechanical part of CMP processes. During use of the fixed-abrasive pad to planarize or polish one or more layers on the surface of a semiconductor device during fabrication thereof, the abrasive material is exposed at a polishing surface of the pad. Some of the abrasive material may also be leached out of the pad. As a result of the inclusion of abrasive particles in the pad, the chemical slurries that are used to effect the chemical portion of chemical-mechanical polishing or chemical-mechanical planarization need not include the abrasives that are often required when conventional, abrasive-free pads are employed.

Copper Conductive Structures

The use of copper as a conductive material in semiconductor devices is also ever-increasing. When copper is used in semiconductor devices, however, a barrier layer is typically required between the copper and adjacent structures or layers. The barrier layer prevents diffusion of the copper into the adjacent layers or structures, as well as the formation of copper silicides, both of which may cause electrical shorts in semiconductor devices that include copper. Tantalum is an example of a material that is useful as a copper barrier. When tantalum is used, the semiconductor device, including any features thereof into which copper is to be disposed (e.g., trenches), is lined with a layer of tantalum. The tantalum layer is then typically covered with a thin copper layer, often formed by physical vapor deposition ("PVD") processes. The thin copper layer then acts as a so-called "seed layer" for the formation of a copper structure, such as a conductive line, such as by electroplating processes.

Once the tantalum and copper layers have been formed, it is necessary to isolate separate tantalum-copper conductive structures from one another. CMP processes are typically used to remove the tantalum and copper between the structures from over the active surface of the semiconductor device being fabricated. Slurries that are used in copper CMP processes typically have a pH of about 7.0. Many of these slurries include hydrogen peroxide ($H_2O_2$) as an oxidizing agent. Since hydrogen peroxide readily generates hydroxy free radicals (OH.), hydrogen peroxide is a very strong oxidizing agent. Tantalum, however, is substantially chemically inert. Thus, the oxidizers of CMP slurries that remove copper do not effectively oxidize tantalum and, thus, do not adequately effect the removal of tantalum. Likewise, slurries that are useful for removing tantalum by CMP processes are likewise not effective for removing copper. As a result, when conventional CMP processes are used to isolate the tantalum-copper conductive structures of a semiconductor device, two separate slurries must be used.

It has been proposed that tungsten be used in place of tantalum in semiconductor devices as a barrier material for copper conductive structures. Nonetheless, when known copper CMP slurries are used to substantially simultaneously CMP tungsten and copper, the tungsten barrier layer may dissolve, or be removed, at a faster rate than the copper.

This is at least partially because, as the following chemical equations illustrate, tungsten (W) is more readily oxidized than copper (Cu):

$$W + 2H_2O \rightarrow 4H^+ + 4e^- + WO_2 \quad E_0 = 0.12;$$

$$Cu \rightarrow Cu^{2+} + 2e^- \quad E_0 = -0.34.$$

Thus, in conventional slurries, although both copper and tungsten are simultaneously exposed to the same oxidants, the tungsten will typically be oxidized first. As a result, gaps may form in locations where the barrier material should be located between copper conductive structures and adjacent portions of the semiconductor device structure upon which the conductive structures are being fabricated.

Figure 1:
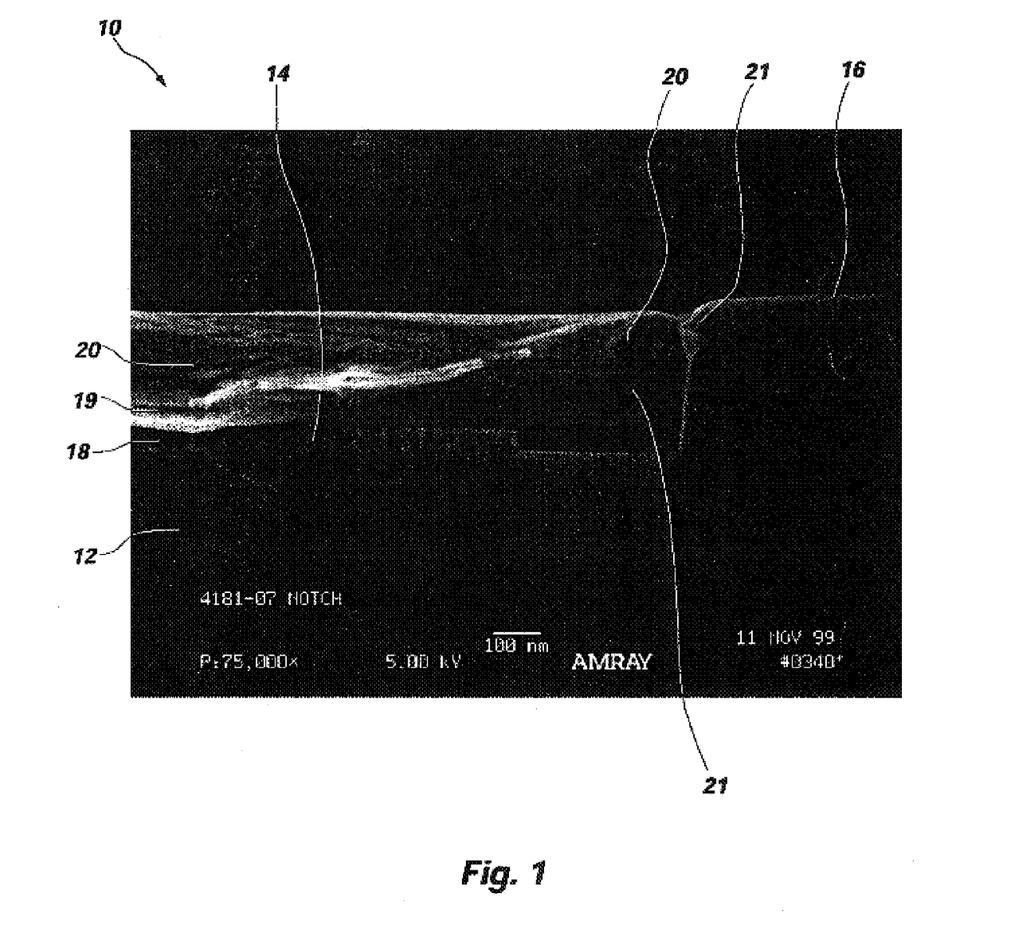
FIG. 1 is an electron micrograph illustrating the dissolution of regions of a tungsten barrier layer that underlie a copper structure of a semiconductor device structure when a conventional slurry is used to simultaneously remove the copper and tungsten.

This phenomenon is illustrated in the electron micrograph of FIG. 1, which illustrates a semiconductor device structure 10 that includes the portions of a copper layer 20 and an underlying tungsten barrier layer 18 disposed within a recess 14 formed in an active surface 16 of a substrate 12 of semiconductor device structure 10 following CMP thereof using an alumina fixed-abrasive polishing pad and a copper CMP slurry having a pH of about 7. Once an interface 19 between barrier layer 18 and copper layer 20 was exposed during the CMP process, tungsten of barrier layer 18 was oxidized and dissolved at a faster rate than the adjacent copper of copper layer 20, leaving a gap 21 between copper layer 20 and adjacent regions of substrate 12, as well as undesirably permitting copper of copper layer 20 to contact and, possibly, diffuse into unprotected adjacent regions of substrate 12.

The inventors are not aware of a slurry that is useful in CMP processes and that effectively polishes or planarizes both copper and tungsten without causing oxidation or dissolution of the tungsten.

BRIEF SUMMARY OF THE INVENTION

The present invention includes a method for substantially simultaneously chemical-mechanical polishing a copper conductive structure and an adjacent barrier layer with a fixed-abrasive type polishing pad, as well as slurries that are useful with fixed-abrasive type polishing pads for substantially simultaneously polishing a copper conductive structure and a barrier layer adjacent thereto.

The method of the present invention includes employing a fixed-abrasive type polishing pad along with a substantially abrasive-free liquid polishing formulation, which is referred to herein as a substantially abrasive-free slurry or, more simply, as a slurry. The slurry is formulated to oxidize copper and a material of the barrier layer, such as tungsten, at substantially the same rates. Thus, in a slurry incorporating teachings of the present invention, the oxidation energies of copper and the barrier material are substantially the same. Preferably, in the slurry, the oxidation energy, or oxidation potential, of a barrier material, such as tungsten, is about 0.25 V greater to about 0.20 V less than an oxidation energy, or oxidation potential, of copper. As the barrier material is oxidized by the slurry at about the same rate as copper or at a slower rate than copper, use of a slurry so formulated to substantially simultaneously polish a copper conductive structure and an adjacent barrier layer prevents dissolution of the barrier layer. When used with a fixed-abrasive polishing pad, the slurry of the present invention removes a barrier material, such as tungsten, at a rate that is about the same as or up to about ten times slower than the rate at which the slurry removes copper and, preferably, at a rate that is about two to about four times slower than the rate at which the slurry removes copper.

Slurries that are useful in the method of the present invention include at least one oxidizer, at least one complexing agent, and at least one inhibitor. The relative amounts of at least the oxidizer, the pH control agent, and the inhibitor are balanced so as to facilitate substantially concurrent polishing of a copper structure and another structure adjacent thereto, such as a barrier layer formed from tungsten. Thus, the slurry is formulated such that the relative amounts of the oxidizer, the complexing agent, and the inhibitor oxidize copper and a barrier material, such as tungsten, at substantially the same rates, or such that the oxidation energies of copper and the barrier material are substantially the same in the slurry. The pH of the slurry may also be optimized so as to provide for oxidation of copper and a barrier material, such as tungsten, at substantially the same rates.

The present invention also includes a system for substantially simultaneously polishing a copper conductive structure and an adjacent barrier layer of a semiconductor device. Such a system includes a fixed-abrasive type polishing pad and a substantially abrasive-free slurry within which copper and the material of the barrier layer are oxidized at substantially the same rates, or have substantially the same oxidation energies.

Other features and advantages of the present invention will become apparent to those of ordinary skill in the art through consideration of the ensuing description, the accompanying drawings, and the appended claims.

DETAILED DESCRIPTION OF THE INVENTION

Figure 2:
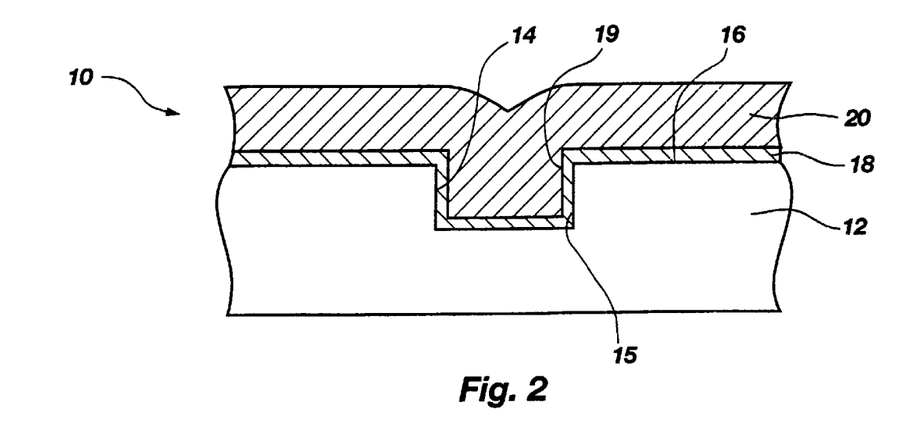
FIGS. 2–5 schematically illustrate an exemplary embodiment of a polishing method in which copper and a barrier material therefor are substantially simultaneously removed from a semiconductor device structure at substantially the same rates.

A method incorporating teachings of the present invention is illustrated in FIGS. 2–5. With reference to FIG. 2, a semiconductor device structure 10 including a substrate 12, which includes a recess 14 formed in an active surface 16 thereof is shown. A barrier layer 18 of a material, such as tungsten, that prevents copper from diffusing into adjacent insulative regions of semiconductor device structure 10 is located on active surface 16 and on the surfaces 15 of recess 14. A copper layer 20 is formed over and contacts barrier layer 18. Copper layer 20 also substantially fills recess 14. Although substrate 12 may include various other structures beneath recess 14, barrier layer 18, and copper layer 20, for purposes of simplicity, no additional structures are illustrated in the semiconductor device structure 10 shown in FIGS. 2–5.

Figure 3:
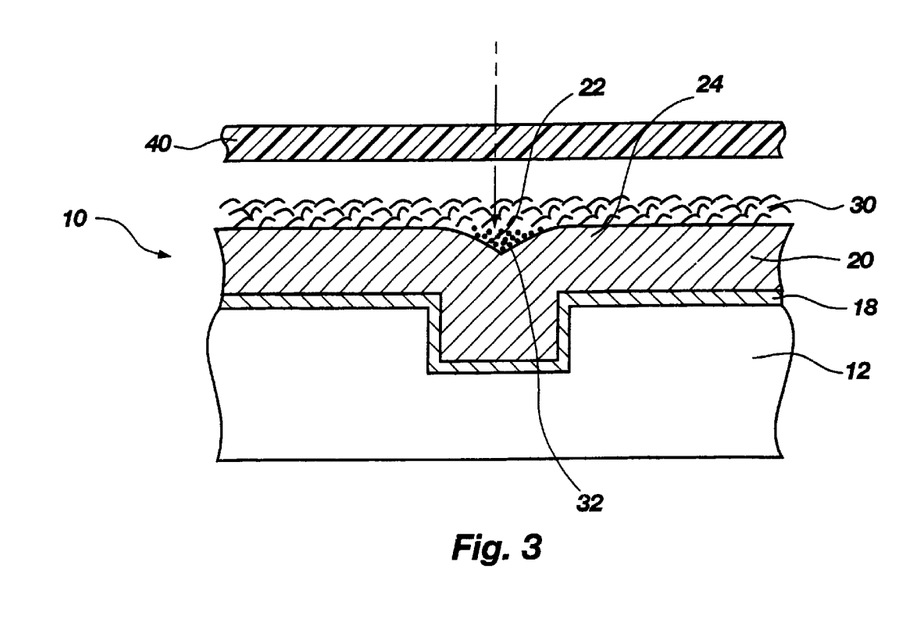

In forming a conductive structure from copper layer 20, portions of copper layer 20 and of barrier layer 18 that are not located within recess 14 must be removed from semiconductor device structure 10. As discussed previously herein, CMP processes are typically used to remove unwanted portions of copper layers. With reference to FIG. 3, a slurry 30 is applied over copper layer 20. A fixed-abrasive polishing pad 40, which may be embodied as a conventional polishing pad, a web-type polishing pad, a belt-type polishing pad, or in any other polishing pad format known in the art, is then brought into frictional contact (e.g., by rotation of semiconductor device structure 10 or polishing pad 40) with copper layer 20 to, along with slurry 30, remove copper layer 20. An inhibitor component 32 of slurry 30 fills recessed areas 22 of copper layer 20, thereby preventing removal of material from recessed areas 22 until material of higher areas 24 of copper layer 20 has been removed.

Figure 4:
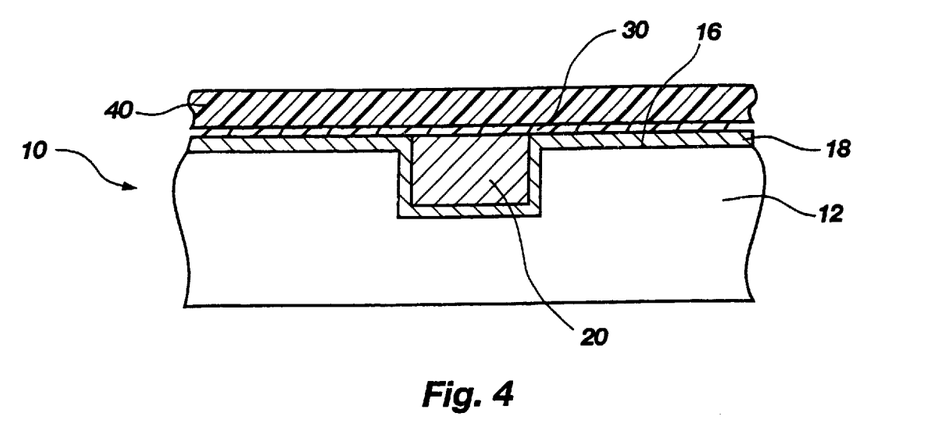

Eventually, regions of barrier layer 18 overlying active surface 16 are exposed through copper layer 20, as shown in FIG. 4. At this point, slurry 30 and fixed-abrasive polishing pad 40 remove the material or materials of barrier layer 18 and the copper of copper layer 20 at substantially the same rates.

Figure 5:
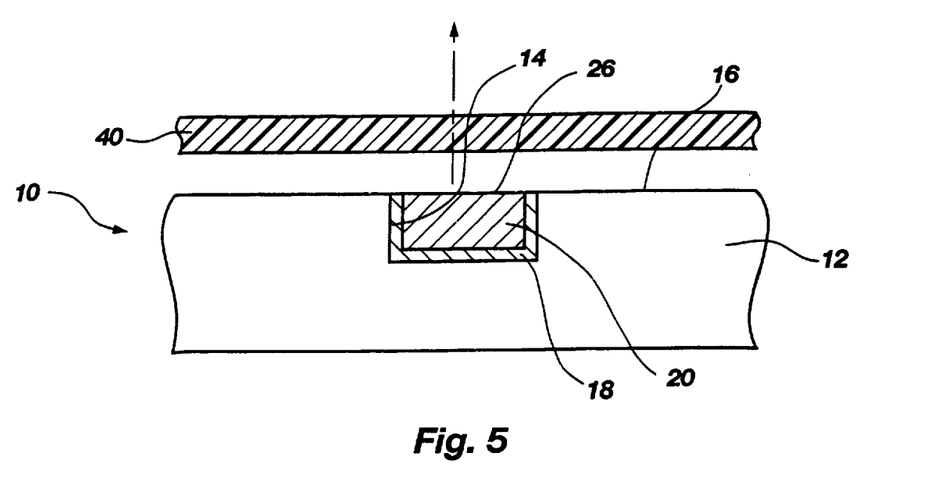

Barrier layer 18 is removed from active surface 16 by continued polishing with slurry 30 and fixed-abrasive polishing pad 40. Once barrier layer 18 is substantially removed from active surface 16 and the surface 26 of the portion of copper layer 20 that remains within recess 14 is located substantially in the plane of active surface 16, as depicted in FIG. 5, the polishing process is terminated. As illustrated in FIG. 5, the remaining portion of barrier layer 18 substantially lines recess 14 and separates the remaining portion of copper layer 20 from adjacent portions of substrate 12.

In order to effect removal of copper and the material or materials (e.g., tungsten) of an adjacent barrier layer 18 or other structure by CMP at substantially the same rates, slurry 30 is formulated so as to oxidize copper and the material or materials of the adjacent barrier layer 18 at substantially the same rates. Stated another way, copper and the material or materials (e.g., tungsten) of the adjacent barrier layer 18 have substantially the same oxidation energies in slurry 30. As a result, as an interface 19 between layers 18 and 20 is exposed to slurry 30, the material or materials of barrier layer 18 will not dissolve, or be removed from semiconductor device structure 10, at a significantly greater rate than copper of copper layer 20 is dissolved or removed from semiconductor device structure 10. By way of example only, and not to limit the scope of the present invention, the oxidation energy, or oxidation potential, of tungsten in slurry 30 is preferably about 0.25 V more to about 0.20 V less than the oxidation energy, or oxidation potential, of copper in slurry 30. Slurry 30 preferably removes a barrier material, such as tungsten, at a rate that is about the same as or up to about ten times slower than the rate at which slurry 30 removes copper when a fixed-abrasive polishing pad is employed and, more preferably, at a rate that is about two to about four times slower than the rate at which slurry 30 removes copper.

With continued reference to FIGS. 2–5, slurry 30 is intended to be used in conjunction with a fixed-abrasive polishing pad 40, such as the acrylic fixed-abrasive polishing pads manufactured by 3M Company of St. Paul, Minn. Such a fixed-abrasive polishing pad 40 may be impregnated with particulate abrasives including, but not limited to, alumina ($Al_2O_3$), titanium dioxide ($TiO_2$), silicon dioxide ($SiO_2$), and cerium dioxide ($CeO_2$). The abrasives in a fixed-abrasive polishing pad 40 are typically leached therefrom during polishing of a semiconductor device structure 10. Thus, slurry 30 need not include abrasives and is preferably substantially free of abrasives. Slurry 30 includes an inhibitor component 32, which prevents recessed, or lower, areas 22 of copper layer 20 from being removed until higher areas 24 of copper layer 20 have been removed down to substantially the same plane. Slurry 30 also includes an oxidizer component, which oxidizes both the copper of copper layer 20 and the material or materials (e.g., tungsten) of barrier layer 18 so as to chemically soften these materials and to thereby facilitate their mechanical removal from semiconductor device structure 10 by fixed-abrasive polishing pad 40. In addition, slurry 30 includes one or more complexing agents, which complex with ions of the layers 18, 20 being removed (e.g., copper ions from copper layer 20) so as to facilitate the dissolution of these reactant ions, allowing these reactant ions to be moved away from the locations at which layers 18 and 20 are being oxidized. As a result, the continued oxidation of material layers 18, 20 by slurry 30 may occur at optimal rates and, thus, the rates at which the materials of layers 18 and 20 are removed from semiconductor device structure 10 may also be optimized.

Examples of oxidizers that are useful as the oxidizer component of slurry 30 include, without limitation, hydrogen peroxide, potassium iodate, potassium permanganate, ammonia, other amine compounds, ammonium compounds, nitrate compounds, and combinations thereof. Exemplary ammonium compounds include, without limitation, ammonium persulfate and ammonium molybdate. Exemplary nitrate compounds include, but are not limited to, ferric nitrate, nitric acid, and potassium nitrate. The oxidizer component preferably comprises about 0.1 to about 20%, by weight, of slurry 30. It is preferred that slurry 30 include about 0.1 to about 5.0%, by weight, of the oxidizer component. Even more preferred is a potassium iodate oxidizer component that makes up about 3 to about 5% of the weight of slurry 30.

The one or more complexing agents of slurry 30 may include, but are not limited to, glycine, ammonium citrate, ammonium phosphate, ammonium acetate, and combinations thereof. Slurry 30 preferably includes about 1 to about 15% of the one or more complexing agents, by weight. It is more preferred that the one or more complexing agents make up about 3 to about 5% of the weight of slurry 30. For example, slurry 30 may include about 1% of the complexing agent glycine, including a concentration of 0.1 M (molar) polyethylene glycol (PEG), by weight of slurry 30. As another example, slurry 30 may include about 3% ammonium acetate, by weight.

Inhibitor component 32 of slurry 30 prevents corrosion of copper during polishing. Inhibitor component 32 may include an azole, such as benzenetriazole (BTA), mercaptobenzothiazole, and tolytriazole, an amine, such as methylamine and diethylamine, a ring compound, such as pyridine, quinoline, and dicyclohexamine nitrate, as well as other compounds, such as potassium silicate, ammonium borate, ammonium phosphate, and potassium dichromate, or mixtures of any of these corrosion inhibitors. While inhibitor component 32 may make up about 0.05 to about 2% of the weight of slurry 30, it is preferred the inhibitor component 32 comprise about 0.05 to about 0.2% of the weight of slurry 30. For example, slurry 30 may include about 0.1% BTA, by weight.

Slurry 30 may have a pH in the range of about 2 to about 6, but the pH of slurry 30 is preferably in the range of about 3 to about 5 and, more preferably, is about 4. One or more buffers, which are also referred to herein as pH control agents, may be used, as known in the art, to adjust the pH of slurry 30 to a desired level. Exemplary buffers that may be used in slurry 30 include, without limitation, potassium hydrogen phthalate, ammonium acetate, ammonium oxalate, ammonium carbamate, ammonium phosphate, ammonium hydrogen phosphate, ammonium dihydrogen phosphate, dibasic ammonium citrate, tribasic ammonium citrate, and mixtures thereof. Acetic acid, phosphoric acid, and sulfuric acid are examples of other pH control agents that may be used in a slurry 30 incorporating teachings of the present invention. Preferably, the pH control agent will adjust the pH of slurry 30 to a desirable range or point without significantly etching the insulator (e.g., borophosphosilicate glass (BPSG), phosphosilicate glass (PSG), or borosilicate glass (BSG)) that underlies the layer or layers being polished. Without limitation, acetic acid is an example of a buffer that may be used to adjust the pH of slurry 30 and that will not etch an underlying glass insulator.

In addition, slurry 30 may include a surfactant component, which may comprise from about 1% to about 15% of the volume of slurry 30 and, more preferably, about 1% to about 2% of the weight of slurry 30. The surfactant component may include, for example, polyethylene glycol, polyoxyethylene ether, glycerol, polypropylene glycol, polyoxyethylene lauryl ether, polyoxyethylene cetyl ether, polyoxyethylene stearyl ether, polyoxyethylene oleyl ether, and mixtures thereof.

Thickeners may also be included in slurry 30 to impart slurry 30 with a desired viscosity (e.g., about 10 to about 20 cps. at ambient temperature). Exemplary thickeners that may be included in slurry 30 include, but are not limited to, POLYOX®, available from Union Carbide of Danbury, Conn., and CARBOPOL®, available from B.F. Goodrich of Cleveland, Ohio.

Water may be used as the balance of slurry 30.

The specific amounts of the components of slurry 30 may be determined by identifying slurry 30 formulations in which copper gives up electrons at substantially the same rate as a barrier material, such as tungsten, of a barrier layer 18 to be polished substantially simultaneously with copper layer 20. Stated another way, slurry 30 may be formulated so that copper and a barrier material therefor, such as tungsten, have the substantially same oxidation energies therein, or are oxidized at substantially the same rates therein. Preferably, the oxidation energy of tungsten or another barrier material in slurry 30 is within the range of about 0.25 V more than to about 0.20 V less than the oxidation energy of copper in slurry 30, the range including the end point values thereof. These formulations of slurry 30 will facilitate the removal of copper and a barrier material, such as tungsten, from a semiconductor device structure 10 at substantially the same rates.

Slurry 30 formulations having these characteristics may be determined as known in the art, such as by measuring the open circuit potentials of copper and a barrier material, such as tungsten, in slurry 30.

Figure 6:
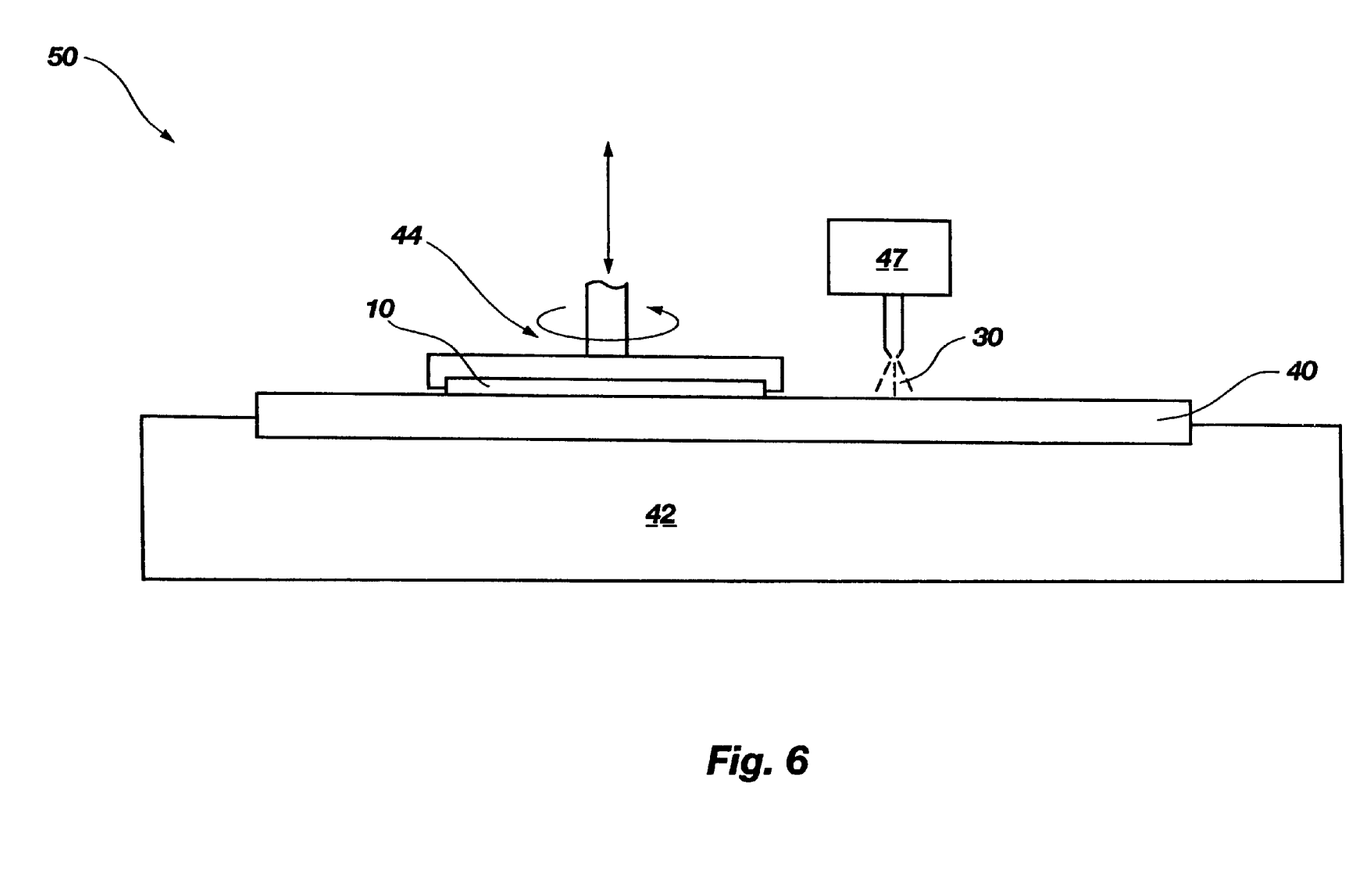
FIG. 6 is a schematic representation of an exemplary embodiment of a system that employs a fixed-abrasive polishing pad and a slurry to effect the method of the present invention.

Referring now to FIG. 6, a polishing system 50 for effecting the substantially simultaneous polishing of copper and an adjacent barrier material in accordance with the method of the present invention is illustrated. Polishing system 50 includes a polishing apparatus 42, which supports or carries a fixed-abrasive polishing pad 40, and a substrate support 44 configured to hold a semiconductor device structure 10, to bring the same into frictional contact with fixed-abrasive polishing pad 40, and, preferably, to rotate semiconductor device structure 10 relative to fixed-abrasive polishing pad 40. Polishing system 50 also includes a slurry applicator 47. Although polishing apparatus 42 is illustrated in FIG. 6 as a web-type polishing apparatus, other known types of polishing apparatus, including, without limitation, belt-type and conventional rotational-type polishing apparatus, may alternatively be used in polishing systems incorporating teachings of the present invention.

Any known CMP apparatus, including conventional, rotary CMP apparatus, web format CMP apparatus, and belt format CMP apparatus, may comprise polishing apparatus 42, substrate support 44, and slurry applicator 47 of polishing system 50. Fixed-abrasive polishing pad 40 may similarly include any known fixed-abrasive polishing pad, such as the acrylic fixed-abrasive polishing pads available from 3M Company, in any known pad format (e.g., conventional, web, or belt).

In use of polishing system 50, one or more semiconductor device structures 10 having one or more layers thereon that are to be chemical-mechanical polished are secured to substrate support 44. If necessary, fixed-abrasive polishing pad 40 is also secured to polishing apparatus 42. Slurry 30 is introduced by slurry applicator 47 onto one or both of semiconductor device structure 10 and fixed-abrasive polishing pad 40. Once slurry 30 has been applied to fixed-abrasive polishing pad 40, one or both of semiconductor device structure 10 and fixed-abrasive polishing pad 40 are substantially continuously laterally moved (e.g., rotated or vibrated or otherwise moved side-to-side) and brought into frictional contact with one another so as to effect the CMP process. For example, when a web format or belt format polishing apparatus is employed, the apparatus may precess semiconductor device structure 10 (i.e., rotate semiconductor device structure 10 around the axis of a support therefor), while the polishing pad remains substantially stationary.

Once the desired portions of one or more layers 18, 20 (FIGS. 2–5) have been removed from semiconductor device structure 10, semiconductor device structure 10 is moved away from fixed-abrasive polishing pad 40. Slurry 30 remaining on semiconductor device structure 10 is rinsed or otherwise removed therefrom by known processes. Subsequent fabrication processes may then be conducted on semiconductor device structure 10, as known in the art. Polishing pad 40 may be incrementally moved to provide a fresh pad segment that was not utilized to polish semiconductor device structure 10. Polishing pad 40 may be moved a distance that is less than the distance across (e.g., diameter) a semiconductor device structure 10 to be polished therewith. Preferably, polishing pad 40 is moved a distance that is at most about 1% of the maximum distance across semiconductor device structure 10 so as to uniformly polish semiconductor device structures 10 and to maximize the useful life of polishing pad 40. As an example, following the use of a polishing pad 40 to polish one or more 8 inch wafers, polishing pad 40 may be incrementally moved about a quarter of an inch (i.e., about 0.25 inches) between polishing each wafer or set of wafers.

While polishing in accordance with the present invention may be conducted at any suitable polishing temperature, polishing with slurry 30 and a fixed-abrasive polishing pad 40 may be conducted at lower temperatures than those of conventional polishing processes. For example, polishing methods that incorporate teachings of the present invention may be conducted at temperatures of about room temperature (e.g., about 23–27° C.) or cooler. It has been found that polishing causes fewer defects when conducted at cooler temperatures. The abrasive components of conventional slurries do not, however, remain soluble in or, thus, evenly dispersed throughout such slurries at cooler temperatures.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method for chemical-mechanical polishing a copper structure and an adjacent barrier layer of a semiconductor device structure, comprising:
    providing a semiconductor device structure including at least one recess formed in a surface thereof, a barrier layer lining at least the at least one recess, and a conductive layer comprising copper over the barrier layer; and
    substantially concurrently polishing the conductive layer and the barrier layer with a fixed-abrasive pad and a substantially abrasive-free slurry, the polishing being effected without oxidizing a material of the barrier layer at a substantially greater rate than the copper is oxidized.

2. The method of claim 1, wherein substantially concurrently polishing comprises employing a slurry formulated to effect an oxidation rate of the barrier layer substantially the same as or less than an oxidation rate of the copper.

3. The method of claim 1, wherein substantially concurrently polishing comprises employing a slurry formulated to provide substantially similar oxidation energies of the barrier layer and the copper.

4. The method of claim 3, wherein employing the slurry comprises employing a slurry in which an oxidation energy of the barrier layer is from about 0.25 V greater than to about 0.20 V less than an oxidation energy of copper.

5. The method of claim 1, wherein substantially concurrently polishing comprises employing a slurry in which a removal rate of the material of the barrier layer is up to about ten times slower than a removal rate of the copper.

6. The method of claim 1, wherein substantially concurrently polishing comprises employing a slurry in which a removal rate of the material of the barrier layer is about two to about four times slower than a removal rate of the copper.

7. The method of claim 1, wherein substantially concurrently polishing comprises substantially preventing dissolution of the barrier layer.

8. The method of claim 1, wherein providing the semiconductor device structure comprises providing a semiconductor device structure with a barrier layer comprising tungsten.

9. The method of claim 1, wherein substantially concurrently polishing is effected at ambient temperature or cooler.

10. A method for chemical-mechanical polishing a copper conductive structure and an adjacent barrier layer of a semiconductor device structure, comprising:
    providing a semiconductor device structure including at least one recess formed in a surface thereof, a barrier layer lining at least the at least one recess, and a conductive layer comprising copper over the barrier layer; and
    substantially concurrently polishing the barrier layer and the conductive layer without oxidizing a material of the barrier layer at a substantially greater rate than the copper is oxidized.

11. A method for chemical-mechanical polishing a copper layer and an adjacent barrier layer of a semiconductor device structure, comprising:
    providing a semiconductor device structure including:
        at least one recess;
        a barrier layer lining the at least one recess;
        a conductive layer comprising copper over the barrier layer; and substantially concurrently polishing at least a portion of the conductive layer and an adjacent
        portion of the barrier layer without substantially dissolving the barrier layer.

12. The method of claim 11, wherein providing the semiconductor device structure comprises providing a semiconductor device structure with a barrier layer comprising tungsten.

13. The method of claim 12, wherein substantially concurrently polishing comprises substantially concurrently polishing at least the portion of the conductive layer and at least the adjacent portion of the barrier layer without substantially dissolving the tungsten of the barrier layer.

14. The method of claim 12, wherein substantially concurrently polishing comprises employing a polishing pad.

15. The method of claim 14, wherein employing the polishing pad comprises employing a fixed-abrasive polishing pad.

16. The method of claim 12, wherein substantially concurrently polishing comprises employing a slurry.

17. The method of claim 16, wherein employing the slurry comprises employing a slurry formulated to oxidize the copper of the conductive layer at substantially the same rate as or a faster rate than the tungsten of the barrier layer is oxidized.

18. The method of claim 16, wherein employing the slurry comprises employing a slurry formulated to provide substantially similar oxidation energies of the tungsten and the copper.

19. The method of claim 18, wherein, in the slurry, the oxidation energy of the tungsten is from about 0.25 V more to about 0.20 V less than the oxidation energy of the copper.

20. The method of claim 16, wherein employing the slurry comprises employing a slurry in which a removal rate of the tungsten is up to about ten times less than a removal rate of the copper.

21. The method of claim 16, wherein employing the slurry comprises employing a slurry in which a removal rate of the tungsten is about two to about four times less than a removal rate of the copper.

22. A method for polishing a conductive structure of a semiconductor device structure, the conductive structure including a conductive region comprising copper and a barrier layer adjacent the conductive region, the method comprising:
    providing the semiconductor device structure;
    applying to the conductive structure a slurry substantially free of abrasive particles and that substantially simultaneously oxidizes copper and a material of the barrier layer; and
    polishing at least the conductive structure with a fixed-abrasive polishing pad and the slurry.

23. The method of claim 22, wherein providing the semiconductor device structure comprises providing the semiconductor device structure with the barrier layer of the conductive structure comprising tungsten.

24. The method of claim 22, wherein, in slurry, the copper of the conductive region of the conductive structure is oxidized at substantially the same rate as or at a faster rate than the material of the barrier layer is oxidized.

25. The method of claim 22, wherein, in the slurry, the copper of the conductive region of the conductive structure and the material of the barrier layer of the conductive structure are polished without substantially dissolving portions of the material of the barrier layer located beneath remaining portions of the copper.

26. The method of claim 22, wherein, in the slurry, the material of the barrier layer and the copper exhibit substantially the same oxidation energies.

27. The method of claim 26, wherein, in the slurry, the material of the barrier layer has an oxidation energy of from about 0.25 V more to about 0.20 V less than an oxidation energy of the copper.

28. The method of claim 22, wherein, in the slurry, the material of the barrier layer is removed at a rate that is up to about ten times slower than a rate at which the copper is removed.

29. The method of claim 22, wherein, in the slurry, the material of the barrier layer is removed at a rate that is about two to about four times slower than a rate at which the copper is removed.

30. A method for polishing a surface of a semiconductor device structure, the surface including a conductive structure including copper and a barrier layer adjacent the conductive structure, the method comprising substantially concurrently polishing a material of the barrier layer at substantially the same rate as or at a slower rate than a rate at which the conductive structure is polished.

31. The method of claim 30, wherein substantially concurrently polishing comprises employing a fixed-abrasive polishing pad.

32. The method of claim 30, wherein substantially concurrently polishing comprises employing a slurry.

33. The method of claim 32, wherein employing the slurry comprises employing a slurry that is substantially free of abrasive particles.

34. The method of claim 32, wherein employing the slurry comprises employing a slurry in which the material of the barrier layer oxidizes at substantially the same rate as or a slower rate than the copper oxidizes.

35. The method of claim 32, wherein employing the slurry comprises employing a slurry in which the copper and the material of the barrier layer exhibit substantially the same oxidation energies.

36. The method of claim 35, wherein employing the slurry comprises employing a slurry in which an oxidation energy of the material of the barrier layer is from about 0.25 V more to about 0.20 V less than an oxidation energy of the copper.

37. The method of claim 32, wherein employing the slurry comprises employing a slurry in which a removal rate of the material of the barrier layer is up to about ten times less than a removal rate of the copper.

38. The method of claim 32, wherein employing the slurry comprises employing a slurry in which a removal rate of the material of the barrier layer is about two to about four times less than a removal rate of the copper.

39. The method of claim 30, comprising providing a semiconductor device structure with a barrier layer comprising tungsten.

40. The method of claim 30, wherein substantially concurrently polishing is effected without substantially dissolving a portion of the barrier layer located beneath a remaining portion of the conductive structure.

* * * * *